US006349668B1

(12) United States Patent
Sun et al.

(10) Patent No.: US 6,349,668 B1
(45) **Date of Patent: *Feb. 26, 2002**

(54) METHOD AND APPARATUS FOR THIN FILM DEPOSITION ON LARGE AREA SUBSTRATES

(75) Inventors: James J. Sun, New Brighton; Benjamin Y. H. Liu, North Oaks; Virgil A. Marple, Maple Plain, all of MN (US)

(73) Assignee: MSP Corporation, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/067,166

(22) Filed: Apr. 27, 1998

(51) Int. Cl.[7] ................................................ C23C 16/00

(52) U.S. Cl. ............... 118/723 R; 118/728; 118/723 E; 118/723 ER

(58) Field of Search ......................... 219/121.5, 121.52; 156/345; 118/723 R; 356/312, 36; 209/132, 143; 250/255, 370.02; 264/430; 419/48; 422/80, 83; 423/446; 427/213; 73/28.01, 28.05, 863.22, 863.23, 337, 338; 95/29, 32; 96/190, 44

(56) References Cited

U.S. PATENT DOCUMENTS

| | | | | | |
|---|---|---|---|---|---|
| 4,301,002 | A | | 11/1981 | Loo | 209/143 |
| 4,670,135 | A | | 6/1987 | Marple et al. | 509/143 |
| 4,767,524 | A | | 8/1988 | Yeh et al. | 209/143 |
| 4,788,082 | A | * | 11/1988 | Schmitt | 427/248.1 |
| 4,886,359 | A | * | 12/1989 | Berndt | 356/312 |
| 4,990,740 | A | * | 2/1991 | Meyer | 219/121.52 |
| 4,996,080 | A | | 2/1991 | Daraktchiev | 427/57 |
| 5,150,036 | A | * | 9/1992 | Pourprix | 324/71.4 |
| 5,171,360 | A | * | 12/1992 | Orme et al. | 75/331 |
| 5,229,171 | A | | 7/1993 | Donovan et al. | 427/483 |
| 5,316,579 | A | | 5/1994 | McMillan et al. | 118/50 |
| 5,364,562 | A | * | 11/1994 | Wang | 423/593 |
| 5,456,945 | A | | 10/1995 | McMillan et al. | 427/252 |
| 5,540,772 | A | | 7/1996 | McMillan et al. | 118/50 |
| 5,614,252 | A | | 3/1997 | McMillan et al. | 427/99 |
| 5,688,565 | A | | 11/1997 | McMillan et al. | 427/565 |
| 5,807,435 | A | * | 9/1998 | Poliniak et al. | 118/504 |
| 5,916,640 | A | * | 6/1999 | Liu et al. | 427/475 |

FOREIGN PATENT DOCUMENTS

| | | | | |
|---|---|---|---|---|
| FR | 2729400 A | * | 1/1995 | C23C/16/40 |
| WO | WO 98/09731 | | 3/1998 | |

OTHER PUBLICATIONS

H.H. Zhong et al, "Deposition of superconductive YBaCuO films at atmospheric pressure by RF plasma aerosol technique", AIP Conf.Pro.(219) 1, pp.531–542, Apr. 1991.*

Q.H. Powell et al, "Gas–phase coating of TiO2 with SiO2 in a continuous flow hot wall aerosol reactor", J.Mat.Res. (12), 2, pp.552–559, Feb. 1997.*

V. Moshnyaga, "Preparation of rare–earth manganite–oxide thin films by metalorganic aerosol deposition technique", App.Phys.Lett. (74) 19, pp.2842–2844, May 1999.*

* cited by examiner

*Primary Examiner*—Gregory Mills
*Assistant Examiner*—Rudy Zervigon
(74) *Attorney, Agent, or Firm*—Westman, Champlin & Kelly, P.A.

(57) ABSTRACT

A thin film deposition apparatus is used for applying thin films onto substrates, such as large panel displays, as well as integrated circuit devices, and includes a source of an ionized gas that is intermixed with an aerosol prior to deposition. The ionized gas causes the aerosol particles to take on an electrical charge. The aerosol containing the charged particles is concentrated in a virtual impactor and then provided to a shower head or orifice that is used for depositing the aerosol material onto the substrate. The shower head can be moved in a selected pattern to uniformly deposit aerosol particles as a thin film on the substrate.

40 Claims, 8 Drawing Sheets

FIG. 1

- Aerosol Generator — 12
- Aerosol Concentrator — 14
- DC Voltage — 16A
- 10
- Exhaust Pump — 26
- Motion Control — 28
- 16, 24
- 18
- 25 — Inert Gas
- 20
- 27

FIG. 2

- 34 — High Voltage DC Power Supply
- 37, 37A
- 45
- Compressed Gas — 38
- 32, 40, 42
- 36
- 48
- 46 — Liquid
- 30

- High Voltage DC Power Supply — 34
- Compressed Gas — 38
- 30, 50, 52, 32
- Charged Aerosol
- 74
- Filtered Gas — 72
- 73, 71 Liquid, 70, 69

FIG. 5A

- High Voltage DC Power Supply — 34
- Compressed Gas — 38
- 50, 52, 30, 32
- Ionized Gas
- Charged Aerosol
- 73A, 70, 71 Liquid, 69

FIG.6

Aerosol In

Major Flow

Minor Flow

Aerosol In

Major Flow

Minor Flow

METHOD AND APPARATUS FOR THIN FILM DEPOSITION ON LARGE AREA SUBSTRATES

CROSS REFERENCE TO RELATED APPLICATION

Reference is made to our application Ser. No. 08/898,662, filed Jul. 22, 1997.

BACKGROUND OF THE INVENTION

The present invention relates to an apparatus and method to atomize a liquid to form charged particles, which are concentrated into a smaller volume of carrier gas and then deposited onto a substrate. An electric field is used to aid in uniform deposition of the particles.

Technologies for creating thin films on surfaces are basic to the semiconductor industry. Thin films of oxides, nitrides, ceramics, and other materials are used as insulating layers in thin film transistors as part of large-scale integrated circuits (IC) devices. Such devices are used as microprocessors, volatile and non-volatile memories, digital signal processing chips, among others. Conductive metal thin films must also be deposited and be used as conductive pathways, or interconnects, among thin-films transistors used in an IC or for connection to external circuits. Photo-sensitive materials, which are commonly called photoresists, must also be deposited in thin film form during IC fabrication in order to create the needed geometrical patterns by photo-lithography.

Technologies for thin film deposition are well developed for silicon, and other semiconductor materials, such as gallium arsenide. Commonly used methods for thin film deposition include chemical vapor deposition (CVD), plasma enhanced chemical vapor deposition (PECVD), election beam (E-beam) evaporation and sputtering. In all of these methods, the precursor chemicals used in creating the thin films are produced in vapor form. Atoms or molecules of the vapor are then deposited on the semiconductor wafer surface to create the thin film, the exception being photoresist thin films, which are usually produced by the spin-coating process, in which a solution containing the photoresist and a volatile solvent is first applied to a spinning wafer to form a liquid thin film. The volatile solvent is then allowed to evaporate to produce a photoresist thin film on the wafer.

The technologies described above for fabricating thin film transistors on semiconductor wafers have also been adapted for use in making flat-panel displays. The substrates used for flat-panel displays are usually glass and the areas of the substrate are also much larger than that of the wafer. Currently, the largest wafer used in the commercial production of semiconductors is 8 inches (200 mm) in diameter, although wafers of 12 inches (300 mm) diameter are expected to be in wide-spread commercial use beginning in 1999 or in the year 2000. In comparison, flat-panel displays usually involve substrate areas that are much larger. For use as a television (TV) monitor, a flat-panel may need to be as large as 60" in diagonal measure to compete with a TV made with a conventional picture tube. Such large area flat panel displays must be made with a process that is economical and capable of being used for large scale commercial production.

There are two major technical difficulties in producing large area flat panels by means of the convention thin film deposition process. One difficulty is that the conventional CVD, PECVD, E-beam evaporation and sputtering process must be carried out in vacuum. The vacuum typically ranges from a few milli Torr to a few Torr in pressure. To carry out the process in vacuum, a vacuum chamber must be large enough to contain the substrates while carrying out the deposition process. The substrates must first be introduced into the vacuum chamber for thin film processing, and then be removed from the vacuum chamber for additional processing. Large vacuum chambers are expensive to build and operate, and the need to introduce and remove substrates from a vacuum chamber slows down the process, making it very expensive to make large flat panels. A second difficulty relates to the operation of the CVD, PECVD, E-beam evaporation, and sputtering processes, all of which involve depositing one molecule or atom at a time. The process is too slow except for the very thin films that can be used in semiconductors.

Other thin film deposition process have also been tried in the past for semiconductor fabrication. Drakitchiev U.S. Pat. No. 4,996,080 describes a photoresist coating process in which the photoresist solution is atomized to form a spray. The spray droplets are then introduced into a chamber and allowed to settle by gravity onto a substrate at the bottom of the chamber. The substrate is then spun to form a uniform coating of photoresist on the substrate. Donovan et al. U.S. Pat. No. 5,229,171 describes a similar approach in which a photoresist spray is first created and then allowed to deposit on the substrate in a vacuum. Electrodes are incorporated in the apparatus to create an electric field to aid in the deposition process.

The need to create thin films of complex chemicals with special electrical properties has led some inventors to develop thin film deposition by droplets. One such invention is that described by McMillan et al. in U.S. Pat. No. 5,316,579, in which a fine mist is formed by a rotating turbine blade within an enclosure. The mist is then withdrawn under vacuum and allowed to deposit onto a substrate in vacuum by gravity. Methods of creating thin films of ferroelectric, super-conducting, and high dielectric thin films by the method are claimed. Other patents such as U.S. Pat. Nos. 5,456,945, 5,540,772, 5,614,252, and 5,688,565 relate to the improvement of the so-called Liquid Source Misted Chemical Deposition (LSMCD) process and application of the process for creating thin films of barium strontium titanate (a high dielectric constant material) or layered superlattice materials, among others. In all of these inventions, the substrate is placed in a vacuum chamber, and the deposition is also carried out in vacuum, again leading to slow processing and expensive equipment.

As discussed just above, a variety of methods have been developed to atomize liquid to form droplets. Centrifugal atomizers, ultrasonic nebulizers, pump sprayers, and compressed air atomizers/nebulizers are some examples of atomization or nebulization devices that are used in spray painting, in personal care products, such as hair sprayers, deodorizers, and drug delivery devices to deliver drugs in aerosol form into the human lung. Most of these devices produce droplets that are either uncharged or carry only a weak natural electrical charge. The most well known exception is electrostatic spray painting in which a high electrostatic charge is placed on the atomized paint droplets by applying a high voltage to the paint during atomization. Because the paint is held at a high voltage, the paint must be electrically non-conductive. This restricts the conventional electrostatic spray guns to organic solvent based paints. When water based paints such as latex paints and other paints consisting of dispersion of paint in water is to be sprayed, the conventional electrostatic spray guns cannot be used.

In integrated circuit applications, there is considerable interest in recent years in applying thin films onto a semiconductor wafer surface using aerosol deposition processes. These processes can also be used to provide thin film deposition in manufacturing flat-panel displays. Typically, the precursor chemical used in the aerosol deposition process is a chemical compound dissolved in a solvent or a complex mixture of several chemical species dissolved in a solvent. To preserve the chemical nature of the material or the composition of the desired chemical elements in the thin film, the liquid solution is atomized to form a droplet aerosol—also referred to as a mist—which in turn is deposited onto the surface. Conventional chemical vapor deposition using a vapor source does not work well with such materials because the vaporization process often alters the chemical nature or the mixture composition which can lead to inferior quality films. An example of the misted deposition process used in fabricating ferroelectric and other high dielectric thin films such as BST (barium, strontium titanate) or SBT (strontium bismuth titanate is that described McMillan et al. U.S. Pat. No. 5,456,945, also mentioned above.

In contrast to the above, insulating thin films of a low dielectric constant are also of considerable interest. Such thin films are needed to replace the silicon dioxide and silicon nitride thin films currently in use in integrated circuit devices. Low dielectric constant thin films will increase the speed of microprocessors, memory and other electronic devices. Polymers are considered ideal because of their low dielectric constant and good insulating properties. For such applications, the polymer may be dissolved in a solution which are in turn deposited on the substrate in droplet form to create a polymer thin film. Alternatively, a monomer may be dissolved in a solution and deposited by the droplet deposition process. The monomer thin film can then be polymerized following deposition. With suitable chemical precursors in a liquid form, the droplet deposition process can be used to fabricate a variety of thin films. Thin films of metal, semiconductor, insulator, polymer and ceramic can be created on a suitable substrate to form part of an integrated circuit device in microelectronics applications. The method and apparatus disclosed in this invention are suitable for all of these applications because of their ability to create uniform thin films of high quality at a sufficiently high speed for the mass production of these devices that are essential for the applications.

Although the droplet aerosol can be deposited directly onto the surface by the usual mechanisms of gravitational settling and Brownian diffusion, the deposition rate that is achievable is quite low and not adequate for the high speed production of integrated circuits. It has been discovered that the deposition rate is increased if the droplet mist is electrically charged.

In a previous U.S. patent application Liu et al., Ser. No. 08/706,664, now U.S. Pat. No. 5,996,640, issued Jun. 29, 1999 several methods to produce a charged droplet aerosol are disclosed. One method is to use an induction electrode placed in closed proximity to the atomizer nozzle. A high voltage is applied to this induction electrode to induce a charge on the surface of the liquid being atomized. The droplets formed this way are electrically charged.

In this invention, an alternative method is described which makes use of a high voltage electrode in a chamber having a compressed gas from a source upstream of the atomizer to produce a high concentration of ions (charged molecules) in the compressed gas. This ionized gas is then used to atomize the liquid to form droplets. Since ions in the compressed gas can collide with the droplets during atomization and impart their charge to the droplets, the resulting droplets are charged. This process has been found to be capable of providing a reproducible source of charged droplets for deposition on surfaces.

SUMMARY OF THE INVENTION

The present invention relates to a method and apparatus to atomize a liquid to form an aerosol of charged droplets or particles, means to concentrate an aerosol from a high volume stream into a small stream to form a concentrated stream of particles. The aerosol can then be deposited on surfaces for a variety of scientific and technical applications. The deposition process can be carried out at or near atmospheric pressure so that the need for a vacuum chamber and the associated vacuum equipment is eliminated. The method and apparatus provide considerable improvement over previous methods both in the speed of deposition, which is essential for the high volume production of large area flat-panel displays, and the lowered cost of the deposition equipment.

The aerosol generation and concentration apparatus has been devised specifically for producing thin films on large areas in order to manufacture large flat-panel displays and other integrated circuit devices on large flat surfaces using the aerosol deposition process. The droplet generating device with or without the concentrator can also be used as an electrostatic sprayer for spray coating applications. The electrostatic sprayer can also be used to produce a charged therapeutic aerosol to increase the deposition efficiency of such aerosols in targeted areas of the human lungs for medical applications. The method is applicable to both conductive and insulating liquids. This feature makes the method and apparatus described herein particularly useful in industrial spray painting applications where water-based conductive paint cannot be easily sprayed using conventional electrostatic spray guns.

Although the invention has been made with the specific purpose of fabricating thin films for flat-panel displays, the method and apparatus can also be used to create thin films for other purposes than flat-panels. One application where this invention is particularly suited is to deposit a ultraviolet (UV) absorbing coating on an underlying substrate on which images have been created by ink-jet and other forms of printing. The UV coating will allow such images to be preserved when used outdoors for advertising purposes. Other applications include optics coating to produce large area optical surfaces with special absorbing, emission, and/ or transmitting characteristics.

Figure 12:
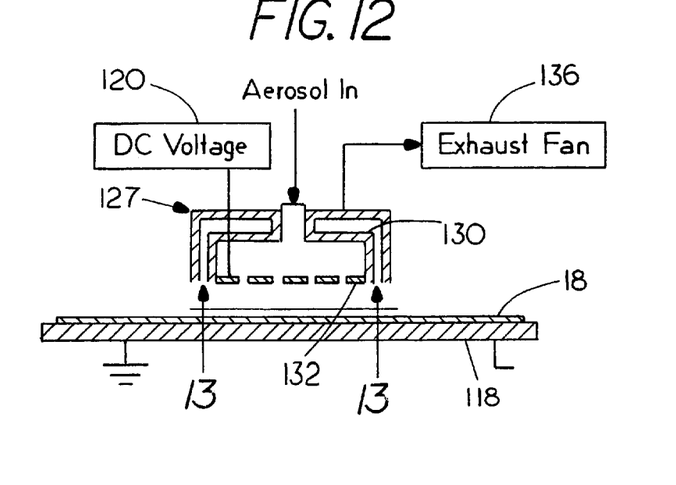
Figure 13:
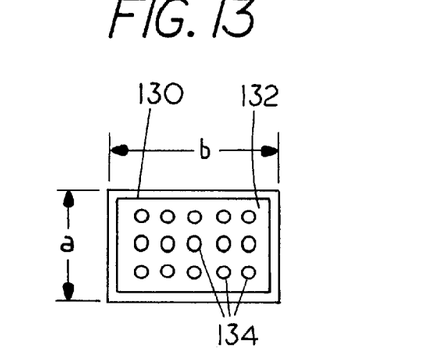
Figure 14:
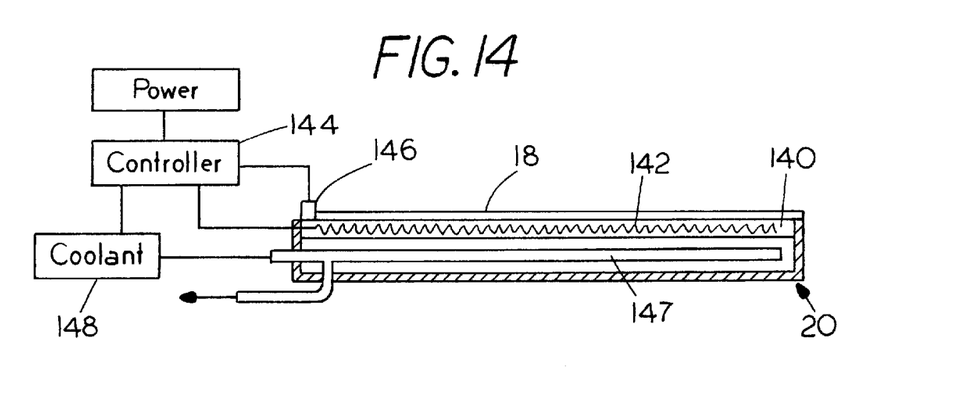
Figure 15:
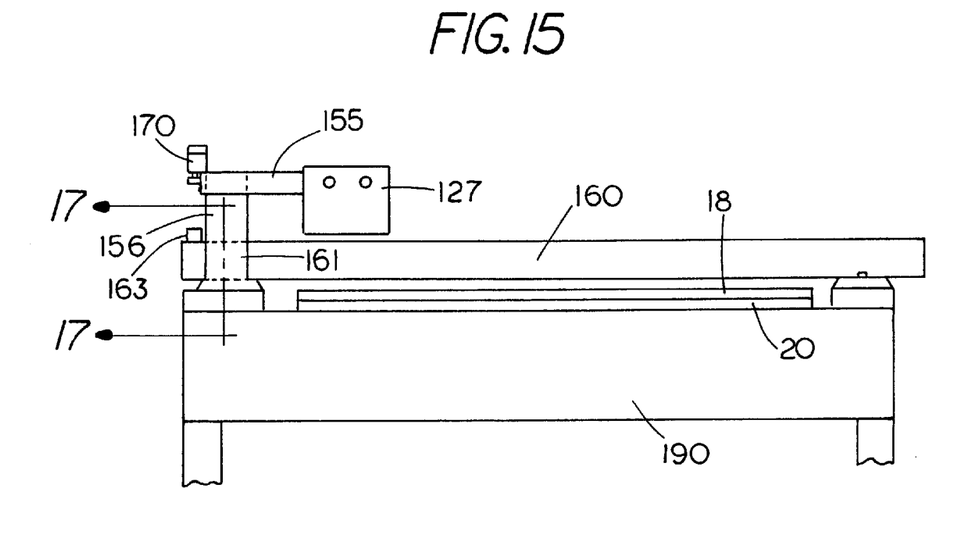
Figure 16:
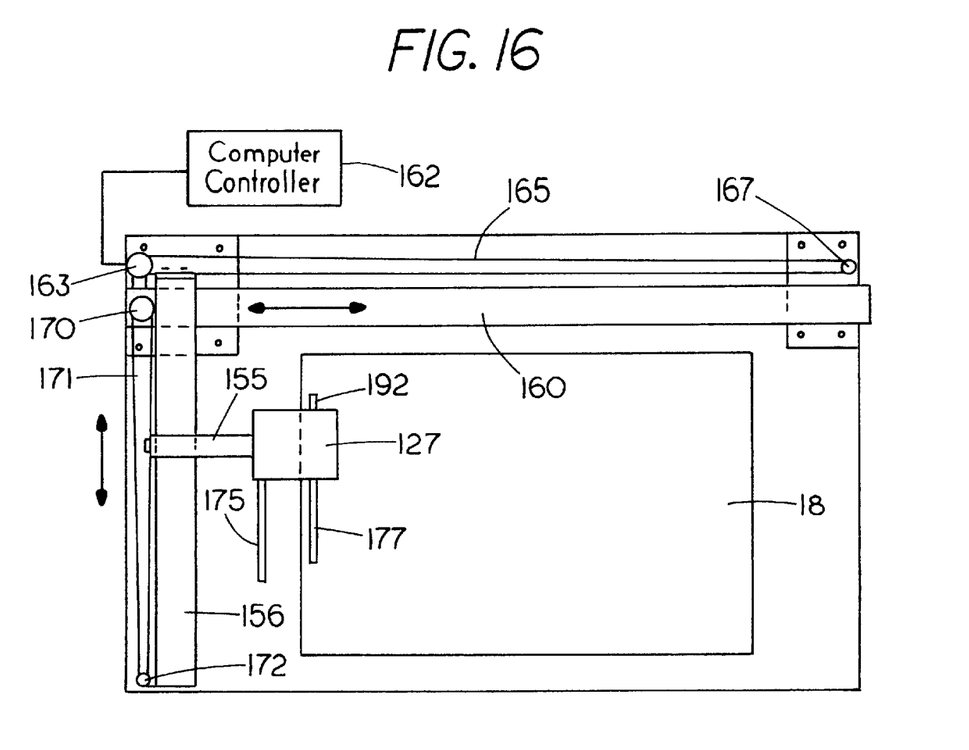
Figure 17:
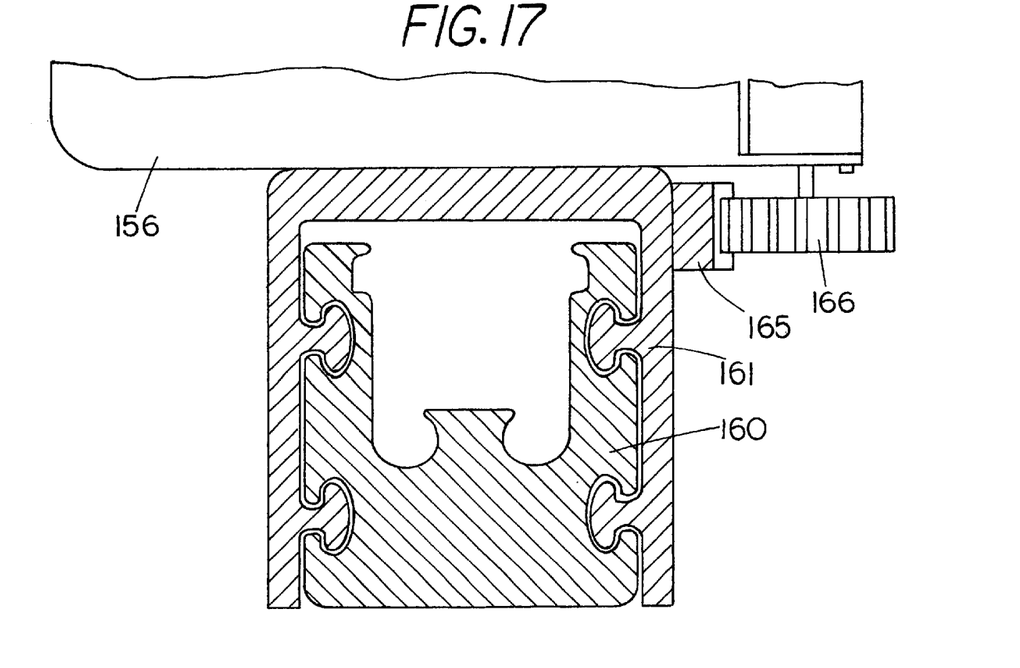

FIG. 12 is a schematic side sectional view of passageways 56A, 56B and 56C for the atomization in jets of the ionized gas exiting orifices 57A, 57B and 57C into passageways 58A, 58B and 58C. Since the gas must be under a sufficiently high pressure to atomize the liquid, the passageway into which the corona ionizer 30 discharges the ionized gas is also under pressure. For instance, in this form, if the supply pressure from source 36 to the corona ionizer 30 is 100 psi, and a 50 psi gas is needed to atomize the liquid, at the atomizers 54A–54C, the gas pressure in the atomizing passageways 57A–57C must also be set to 50 psi. This intermediate gas pressure can be created by using pressure control orifices of the appropriate size for the ionizer and the atomizers.

Figure 1:
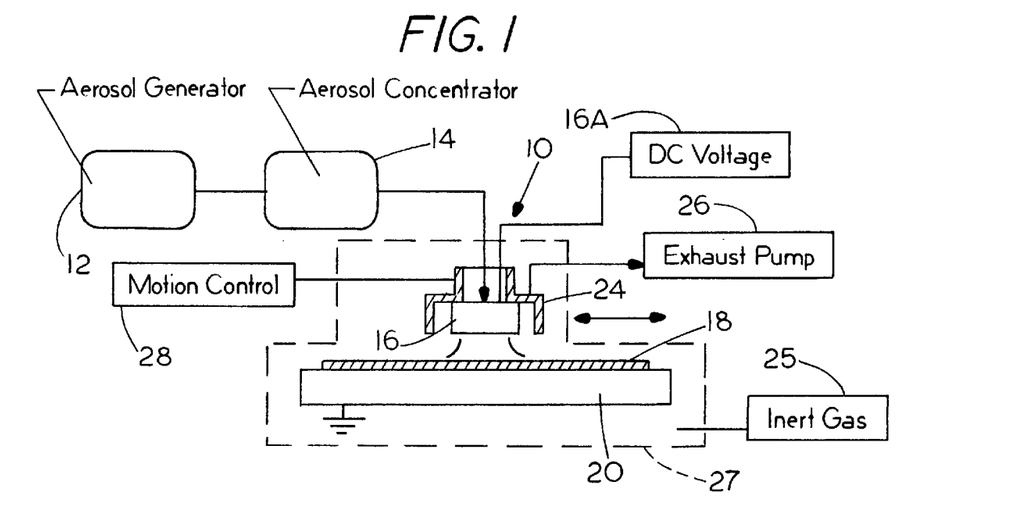
FIG. 1 is a schematic diagram of the apparatus used of the present invention.
Figure 2:
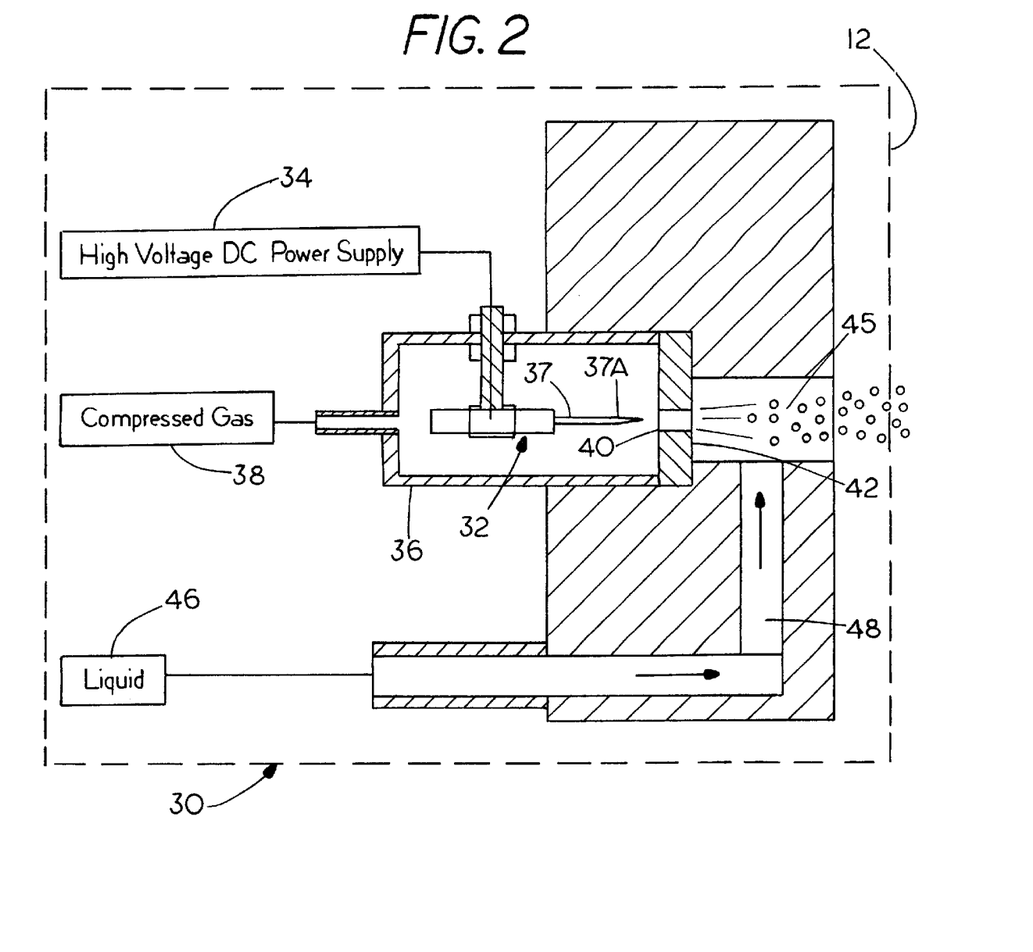
FIG. 2 is a schematic cross sectional view of an ionized gas atomizer used to produce charged particles.
Figure 3:
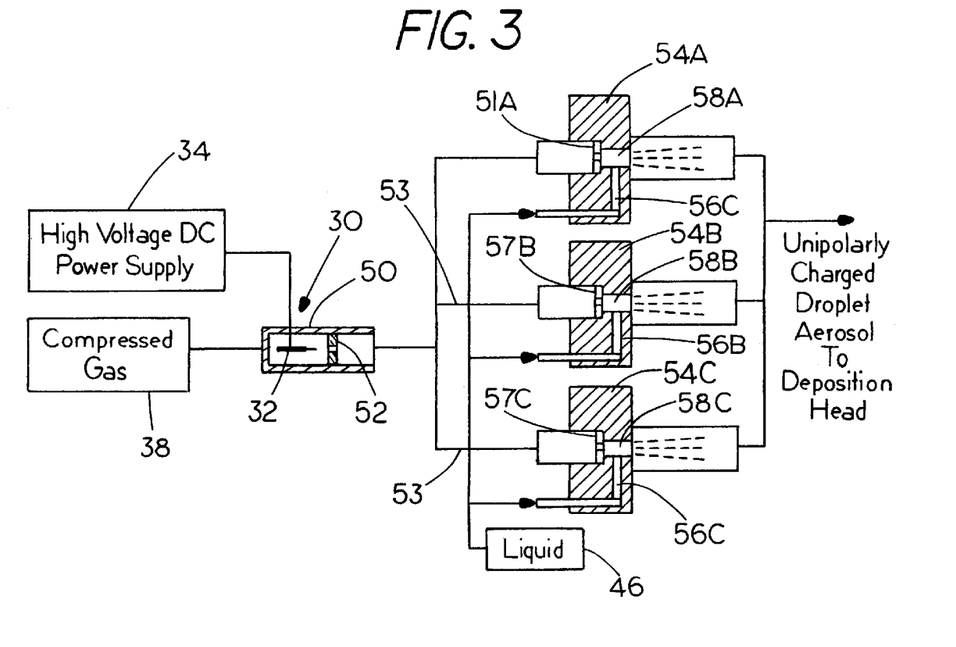
FIG. 3 is a schematic cross sectional view of a modified ionized gas atomizer showing multiple atomizer nozzles connected to a single ionizer.

One advantage of this improvement is that one single ionizer 30 can be used with more than one atomizer 54A–54B to produce a charged droplet aerosol. In FIG. 3, three atomizers 54A–54C are shown. In principle any number of atomizers can be connected to a single ionizer 30 to create a high aerosol output needed for the production of large area flat panels. For instance, if a single atomizer is capable of producing an output aerosol flow rate of 10 liters per minute, ten atomizers can be used in parallel with a single ionizer to produce a total charged droplet aerosol flow of 100 liters per minute. Such high volume output is essential for the generation of charged droplet aerosol at a high rate for the high volume commercial production of flat-panel displays and other applications. Similarly, more than one corona ionizer can be connected to one or more atomizers to provide higher output of ions to impart a greater electric charge to the atomized droplets.

Figure 4:
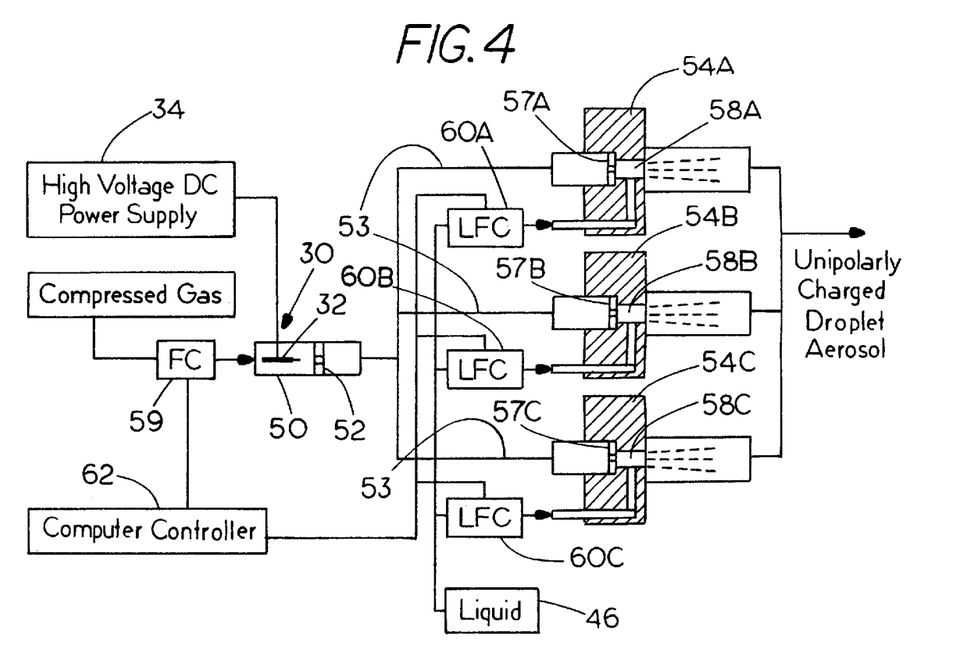
FIG. 4 is a schematic cross sectional view of a further modified ionized gas atomizer using liquid flow controllers for a liquid input, and a gas flow controller for a gas input.

FIG. 4 shows a way to control the gas and liquid flow to the ionizer and the atomizers. A gas flow controller 59 and liquid flow controllers 60A, 60B and 60C can be placed in the passageway for gas to the ionizer 30 and for liquid to atomizers 54A–54C respectively. By applying suitable control signals from a programmable controller, or a microprocessor 62 to each of these flow controllers 59 and 60A–60C, the required gas and liquid flow rates can be set to specific values for the proper operation of the aerosol generator 12, ionizer 30 and atomizers 54A–54C. A signal from the controller 62 can also be used to regulate and turn on and off the gas and/or liquid flow in order to start or stop the aerosol generator, ionizer and atomizer for purposes of automated operation of the aerosol generation and deposition apparatus via computer controller 62.

Figure 5:
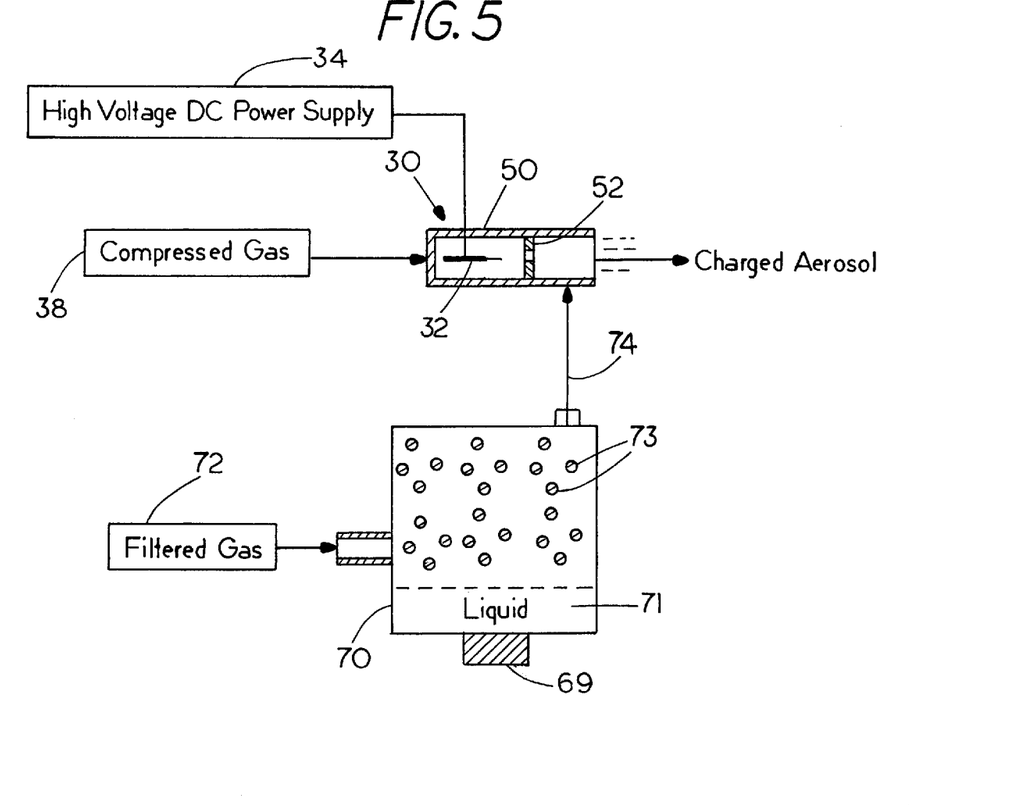
FIGS. 5 and 5A are modified forms of gas ionizer using an ultrasonic transducer to provide an aerosol.
Figure 5A:
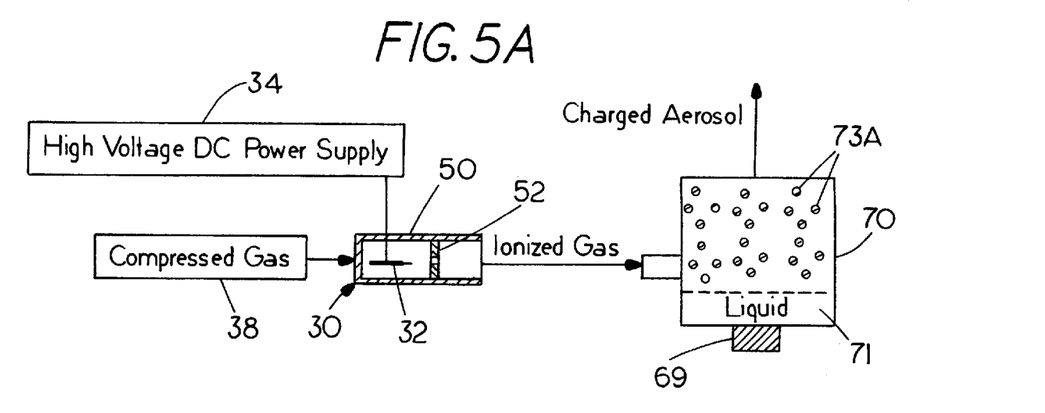

In addition to the compressed gas atomizer described above, other atomizers can also be used for purposes of the present invention. FIGS. 5 and 5A show an ultrasonic atomizer that can be used to produce the aerosol needed for the deposition process. A container 70 having a liquid shown at 71 therein has an ultrasonic transducer 69 attached to a wall of the container, the ultrasonic transducer is used to produce a high frequency, high intensity oscillation which is transmitted to the liquid 71, which generates small liquid aerosol droplets that are carried by a flow of filtered gas from a source 72 that flows through the container into an outlet tube 74. The outlet end of a corona ionizer 30 including chamber 50 to produce a charged droplet aerosol as an output. The corona ionizer 30 includes the compressed gas source 38, chamber 50, orifice 52 power supply 34 and electrode 32.

The charged aerosol can also be provided by introducing the ionized gas directly into container 70, as shown in FIG. 5A. The ionizer 30 output of ionized gas is introduced into the container 70 above the liquid. The droplets 73A take on a charge in the container 70 and a charged aerosol formed from droplets 73A is directly discharged from container 70. This then can be further processed.

Droplet aerosols produced by an atomizer, nebulizer and other aerosol generators contain droplets at a measurable concentration. The droplet concentration, either expressed as the number of droplets per unit volume of the carrier gas, or the droplet mass per unit volume of the carrier gas, is determined by the operating characteristics of the atomizer. The droplet concentration can be varied to a limited extent by varying the operation conditions of the atomizer. For a specific atomizer design, the droplet concentration is usually fixed, and cannot be increased significantly. When the application requires a droplet concentration higher than that which can be provided directly by the atomizer, the droplet concentration must be increased by further processing.

Figures 6, 7:
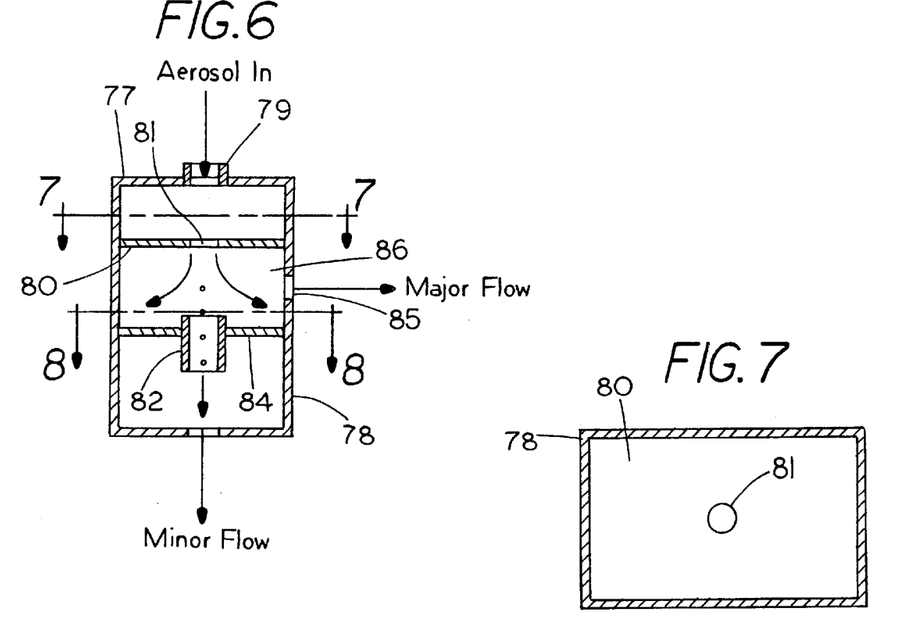
FIG. 6 is a single orifice virtual impactor used as particle concentrator in the apparatus of the present invention.
FIG. 7 is a sectional view taken on line 7—7 in FIG. 6.
Figure 8:
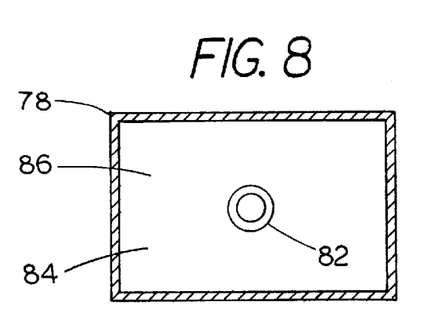
FIG. 8 is a sectional view taken on line 8—8 in FIG. 6.

One device that can be used to increase the droplet or particle concentration of an aerosol is a virtual impactor. FIGS. 6, 7 and 8 show the construction and operating principle of a virtual impactor 77. An outer housing 78 has a flow inlet 79, and a plate or wall 80 forming a chamber. A small orifice, or nozzle 81, through the plate 80 is used to accelerate the aerosol to a suitably high velocity. The high velocity aerosol jet from orifice or nozzle 81 is then directed at a receiving tube 82 supported on and extending through a dividing wall 84, with an inlet facing the orifice or nozzle 81 and an outlet opening on an opposite side of the wall 84. The gas flow established by the aerosol provides a major flow of the gas from the input aerosol through an outlet 85 from a chamber 86 between walls 80 and 84. The outlet size from chamber 86 is selected so that only a small portion (typically 5–20%) of the air flow—the so-called minor flow—is allowed to pass through the receiving tube 82 while the major portion of the aerosol flow (typically 80 to 95%)—the so-called major flow—is deflected side ways in chamber 86 through the outlet 85. Large aerosol particles with a sufficient momentum and inertia will impact into the receiving tube and be carried by the minor flow through the receiving tube into the chamber below. Small particles, on the other hand, have relatively small momentum and inertia will be deflected side ways with the major flow and remain suspended in the major flow through the outlet. The specific particle size at which particles are separated by inertia is referred to as the cut-point diameter of the virtual impactor.

Virtual impactors have been used as particle classifiers to separate large particles from small particles. Loo U.S. Pat. No. 4,301,002 describes an air sampler in which a virtual impactor classifier is used to classify particles by size. The large and small particles are then collected on separate filters for gravimetric or chemical analysis. Marple and Liu U.S. Pat. No. 4,670,135 described a multiple orifice virtual impactor for inertial separation of atmospheric aerosols by size. The large and small particles are also collected separately for gravimetric or chemical analysis. Improvement to the virtual impactor such as that described by Yeh et al. U.S. Pat. No. 4,767,524 have also been made.

In the present application, a virtual impactor is used as a particle concentrator to concentrate particles larger than the cut-point diameter of the aerosol into a small concentrated stream of particles in the minor flow. The particles remain suspended in the minor flow, which is connected to the thin film applying head 16 for deposition on the substrate 18. The concentration ratio of the virtual impactor depends on the relative magnitude of the major and minor flows. For instance, if the aerosol flow entering a virtual impactor is 100 liters per minute, and the minor flow is 10 liters per minute, large particles are separated from the original 100 liters per minute and are concentrated into the minor flow of 10 liter per minute, thereby achieving a concentration ratio of 10 to 1. This means that the mass concentration of droplets above the cut point in the minor flow will be 10 times that in the original aerosol flow.

Figure 9:
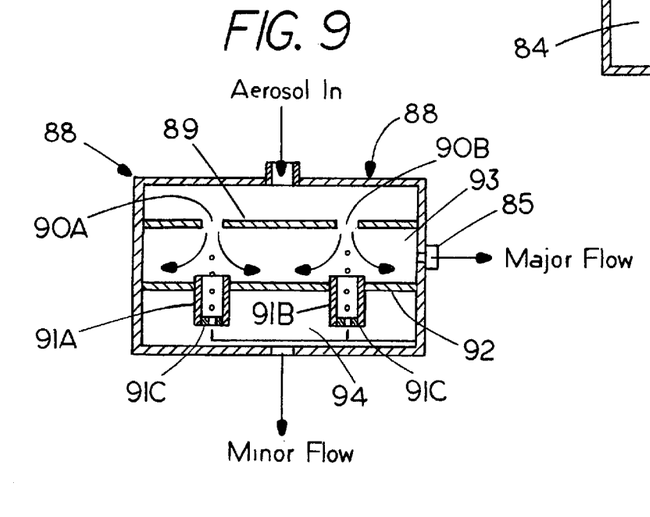
FIG. 9 is a sectional view of a double orifice virtual impactor used with the present invention.

When the required aerosol flow is higher than is can be provided by a single orifice virtual impactor concentrator shown in FIG. 8, two or more virtual impactor sections can be incorporated into one single device to provide the needed higher aerosol flow. By using a large number of orifices and receiving tubes in parallel, very high aerosol flows can be handled by a virtual impactor concentrator. FIG. 9 shows a multi-orifice virtual impactor concentrator 88 that can be used to concentrate aerosol particles from a large flow into a small concentrated stream of particles with substantially increased particle concentration for sizes above the cut-point diameter of the virtual impactor. The virtual impactor 88 has a plate 89 with two orifices or nozzles 90A and 90B, each aligned with a receiving tubes 91A and 91B. The tubes 91A and 91B are held in a wall 92 forming a chamber 93 from which the major flow is removed out of the passageway.

One difficulty with the device shown in FIG. 9 is that large particles entering the receiving tubes 91A and 91B possess considerable inertia and momentum. These particles, upon emerging from the receiving tubes into the lower, minor flow chamber 93 can impact on the aligning wall of the chamber. To reduce impaction loss on the chamber walls, the distance between the receiving tubes and the aligning chamber wall 95 must be increased, thus making the device bulky in size.

Figure 10:
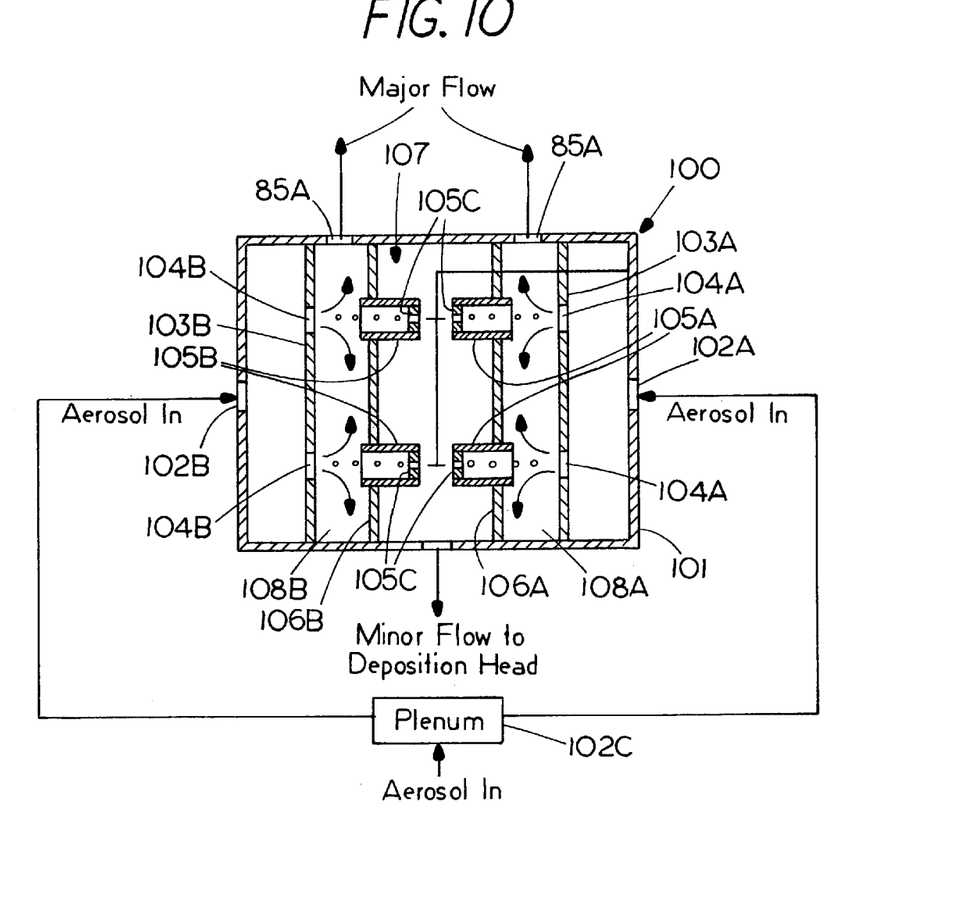
FIG. 10 is a sectional view of four orifice virtual impactor used with the present invention.

Alternatively, the impaction loss on the chamber wall 95 can be greatly reduced, and essentially eliminated by arranging the nozzles and receiving tubes in axially aligned opposing pairs as shown in FIG. 10. The virtual impactor 100 has a housing 101, with inlets 102A and 102B at each of opposite side walls. There are plates or walls 103A and 103B forming inlet chambers, which have orifices 104A and 104B. The orifices are aligned with receiving tubes 105A and 105B that are mounted in walls 106A and 106B forming a common or center minor flow chambers 108A and 108B are also formed by walls 106A and 106B. The desired major flow of the gas from the input aerosol is carried by outlets 85A as shown, from the chambers 108A and 108B.

The inlet chambers can be open to a common plenum 102C having only one aerosol inlet. The plenum leads to both of the inlet chambers. Flow separators or dividers can be used to distribute the aerosol to the two inlet chambers.

The opposing gas jets from each aligning pairs of receiving tubes 105A and 105B will collide with each other in mid-air in chamber 107 to dissipate the momentum and the velocity of the gas jets. These opposing gas jets thus makes it possible to reduce the distance between the receiving tubes, and thereby reducing the overall size of the virtual impactor for a given flow volume.

It has been found that when multiple orifices are used in a concentrator, the orifice and aligning receiving tube diameters become small. The relatively small size of the orifice and receiving tube and the very small air flow passing through each receiving tube makes the pressure drop across the receiving tube very small. A small variation in this pressure drop across the receiving tube has been found to cause significant variation in the air flow from one receiving tube to the next. This can result in non uniform flow distribution, variation in cut-point diameter of each orifice and receiving tube, and increased particle loss in the virtual impactor. In some experimental virtual impactor concentrators the variation in flow through the receiving tubes become severe and in some cases, the flow actually reverses direction due to poor distribution of the flow through the receiving tubes. The receiving tubes do have to be of a size correlated to the orifice size to accept the large particles from the orifice without interference.

It has been found that placing a small flow restricting orifice at the end of each receiving tube as shown at 91C and 105C in FIGS. 9 and 10 will insure uniform flow through the receiving tubes. The orifice diameter must be smaller than the receiving tube diameter and be of such a size that the pressure drop caused by the flow through the receiving tube and the restricting orifice 91C or 105C is increased to a level that reduces the flow variation across the respective receiving tube. A restricting orifice with a bore or opening which is only 5% smaller than the receiving tube diameter will cause significant improvement in the virtual impactor performance, although for practical applications a restricting orifice which is considerable smaller will produce more repeatable and reproducible results. For practical purposes, the restricting orifice diameter should be kept between 5 to 95% of the receiving tube diameter.

The charged droplets produced by the ionized gas atomizers described above are supplied to a thin film applying head 16, which may be a nozzle or a shower head, for deposition on the substrate. If the droplet concentration in the aerosol is not high enough for the commercial production of flat-panel displays, a virtual impactor concentrator described above can be used first to concentrate the droplets into a small air flow. The concentrated droplet stream can then be supplied to such nozzle or a shower head to deposit on the substrate.

Figure 11:
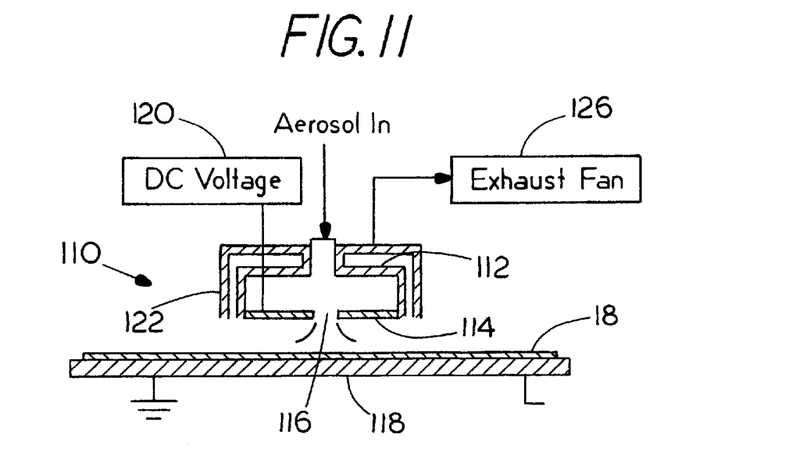
FIG. 11 is a schematic side sectional view of substrate for receiving an aerosol formed according to the present invention held on a substrate holder and showing a nozzle to applying the aerosol as a thin film.

FIG. 11 shows the design of a deposition apparatus 110 consisting of a single deposition head 112 having an electrical conductive material outlet nozzle plate 114 with a single orifice 116 forming the outlet directing the droplet aerosol onto the substrate 18. The substrate 18, usually glass, is usually non-conductive and placed on a substrate holder 118 that is conductive. The substrate holder 118 is usually held at ground potential as indicated, while the conductive (metal) nozzle plate 114 and deposition head is held at a high DC potential from a power source 120. The DC voltage applied to the nozzle plate 114 is of the same polarity as the charge on the charged droplets. The substrate is held at opposite polarity relative to the deposition head from the polarity of the charged particles. For instance, if the droplets are positively charged, the DC voltage applied to the nozzle plate should also be positive. The potential difference thus created between the nozzle plate 114 and the substrate holder 118 causes an electric field to be developed in the region between the two components. This electric field then acts on the electrical charge on the droplets, causing the droplets to deposit on the substrate 18 at a greatly accelerated rate. Since not all droplets may deposit on the substrate, those that remain airborne will escape to the ambient environment, thus contaminating the atmosphere surrounding the apparatus. A shroud or hood 122 surrounds the deposition head 112 as shown in FIG. 11. An exhaust blower or fan 126 provides a suction in the hood and creates an exhaust flow to capture the airborne droplets for safe disposal elsewhere. For safety purposes, the shroud or hood is made of a non-conductive material such as plastic to prevent the high voltage on the nozzle plate 114 to accidentally come in contact with an operator.

Although the above arrangement provides a preferred electrical embodiment of the apparatus for depositing droplets on substrates, it is possible to design a system where the nozzle plate 114 is grounded while the substrate holder 118 is held at a high DC potential. In which case, a positively charged droplet aerosol will require a high negative DC voltage on the substrate holder 118 to create the necessary electric field to attract or direct the droplets to deposit on the substrate 18.

Although a single nozzle in a nozzle plate can be used to direct the droplet aerosol onto the substrate for deposition, the surface coverage of a single nozzle is quite limited. For high aerosol flow and high deposition rates that are needed for the commercial production of flat panels, a multiple nozzle—or multiple orifice—shower head is desired. FIGS. 12 and 13 shows the design of a shower head 130 mounted in a surrounding insulating shroud or hood 127. The shower head has a metal (conductive) outlet plate 132 having a multitude of nozzles or orifices 134 formed therethrough. As before, the shroud 127 has an exhaust fan 136 connected to provide a means to exhaust the undeposited aerosol droplets for safe disposal. The shroud has a lower edge adjacent the substrate. Air flow is into the shroud around the lower edge to draw the droplets into the interior of the shroud so they are carried off in the exhaust flow. The shroud can be used with uncharged droplets as well. On such a system the aerosol can be applied by impaction. The shower head plate 132 may be rectangular in shape with the indicated aspect ratio of a:b, or be square in shaped with a 1:1 aspect ratio.

To achieve uniform droplet deposition on the substrate and to create a thin film of uniform thickness, it is necessary to move the deposition head, whether a nozzle or shower head, over the substrate in some prescribed pattern during deposition. This can most easily be achieved by mounting the nozzle or shower head on a carriage mounted on rails that are at orthogonal axes with linear actuators or stepper motors to move the deposition head in such a pattern as to cover all areas of the substrate uniformly. This will be explained in connection with FIGS. 15–18. The speed of movement of the shower head can also be adjusted to adjust the thickness of thin film deposited. The thickness of the deposited thin film can also be measured optically during or after each deposition. This information can then be used to adjust or control the speed of the nozzle or shower head during subsequent deposition in order to achieve the desired final film thickness.

Although for convenience, the nozzle or shower head can be moved as described above to deposit thin film on the substrate, the nozzle or shower head can also be kept fixed while moving the substrate instead. The proper relative motion between the shower head and the substrate must be created during deposition to create uniform thin films. However, the absolute motion of each is unimportant as long as the desired relative motion is obtained.

Depending on the physical and/or chemical properties of the precursor chemicals used to create the thin film on the substrate and the final property of the thin film desired, it may be necessary to adjust the temperature of the substrate during deposition. In some instances, it may be acceptable to carry out the deposition at room temperature, in which case no heating of the substrate is necessary. However, when heating of the substrate is necessary during deposition or immediately after deposition, variation of the temperature of the substrate holder is needed to vary the temperature of the substrate, which is in contact with the holder.

The substrate holder shown generally at 20 in FIG. 1 is shown in more detail in FIG. 14. The holder 20 includes a conductive metal plate 140 with an embedded electrical heater 142. The temperature of the substrate holder is varied by varying the electrical power applied to the heater through a controller 144. A feedback temperature is provided by a temperature sensor 146 so a set point temperature is maintained by he controller. The substrate holder 20 is also provided with internal cooling passageways below the metal plate. A liquid coolant may be circulated through tubes 147 in the substrate holder from a coolant source 148 to quickly lower its temperature. By this means, the temperature of the substrate can be quickly varied either during deposition, or after each layer of deposition.

The method and apparatus described above are intended for depositing thin films on large area substrates, such as those needed for fabricating flat-panel displays. Using appropriate precursor chemicals, insulating, conducting and/or semiconductor thin films needed for the fabrication of flat-panel displays can be created. Such thin films can also be created on semiconductor wafers by placing one or more such wafer substrates on the substrate holder and depositing the required thin films as described above.

Since the aerosol jet coming out of the film depositing head 16, either a nozzle or a shower head, would impinge on the substrate, the droplets may tend to deposit on the substrate in concentrated spots. To deposit the droplets uniformly over the substrate to create a uniform thin film, it is necessary to move the nozzle or shower head relative to the substrate in some prescribed pattern.

FIGS. 15–18 show a shower head assembly 127 is mounted on a carriage 155. Carriage 155 is mounted on a rail or arm 156 allowing the carriage to be moved in the Y-direction over the substrate. The Y-direction carriage rail 156 has a mounting housing 161 that is in turn mounted for linear sliding movement on an X-axis rail 160, allowing the Y-axis rail 156, the carriage 155, and the shower head 127 mounted on it to be moved in the X-direction as well.

Many different types of support and guide rails can be used, which have movable carriages on them, and the units that use ball bearing tracks, or low friction supports are desirable. They are commercially available, THK Co., Ltd. of Tokyo, Japan, and its affiliated company THK America, Inc. of Schaumburg, Ill., USA make linear motion systems that are satisfactory. In FIG. 17, a simplified schematic cross section is illustrated. The rail of the X-axis is shown only schematically at 160, and has grooves on the sides. The housing 161 for the rail 156 as shown has mating slides and extends around three sides, and can be supported for a low friction mounting and stability. Again, various types of bearings can be used between the housing and the rail.

In order to drive the Y-axis rail 156 and the housing 161, in the form shown schematically, a stepper motor 163 is mounted onto the end of the X-axis rail 160, and it has a positive drive belt 165 driven from a suitable pulley 166 on the stepper motor (see FIG. 17). The belt 165 is mounted over an idler pulley 167 at an opposite end of the X-axis rail, and this belt is fixed to the housing 161. When the stepper motor 163 drives the positive drive belt 165, any rotation of the pulley 166 will cause movement of the rail 156 through the mounting housing 161.

Stepper motors can be set up to move in desired increments, and can be moved quite smoothly, through computer controls, such as the central computer controller 162 can program the speed of movement, and the sequence of movements between the stepper motor 163 and a similar stepper motor 170 that is used for moving the arm 155 and its supporting carriage along the Y-axis rail 156. This will provide a plot for movement of the shower head assembly 157.

The stepper motor 170 as shown is mounted on the rail 156, and it also has a pulley that drives a belt 171 mounted over a pulley 172 and an outer end of the arm 156. By coordinating the movements between the stepper motors 163 and 170, the shower head assembly 127 can be moved in a desired coordinated X-Y path across the substrate 18. Since the shower head assembly 127 requires an input of aerosols, a flexible stainless steel tube shown at 175 can be provided for moving with the shower head across its range of movement while carrying the aerosol to the shower head and a fan evacuation tube 177 also can be provided to lead to the fan for evacuating the hood or shroud.

It is to be understood that the showing of the X and Y-axis rails is illustrative and schematic. The commercial units mentioned may have different constructions.

Figure 18:
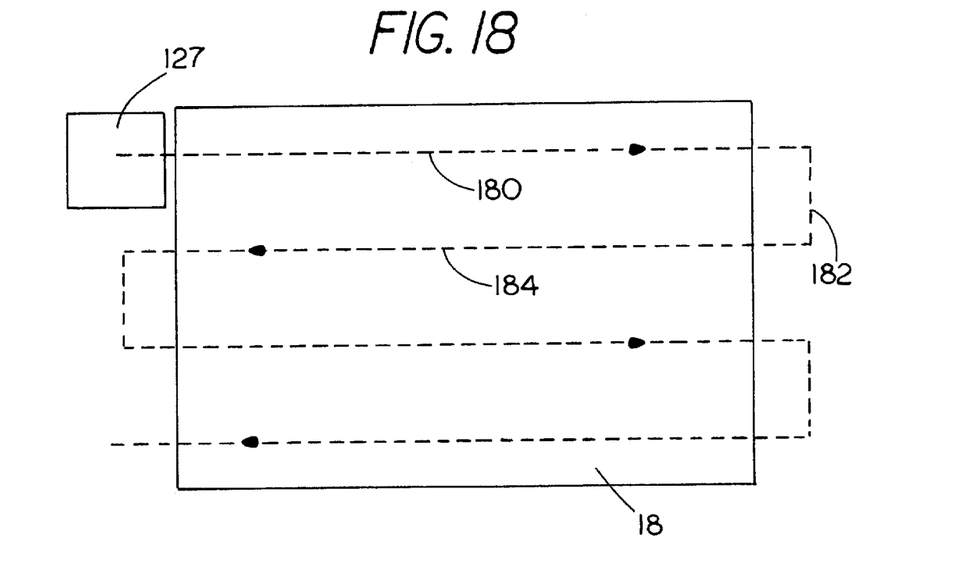

In FIG. 18, a pattern is shown for the shower head assembly 127 moving over the substrates 18. A first path, for example, could be along a path 180, along the X-rail or X-axis, by driving the stepper motor 163. When the length of the substrate 18 has been traversed, which is inputted into the computer control, the stepper motor 170 would be energized to move the shower head assembly 127 laterally along a path 182, and then back along an X-axis path 184 until all of the surface of the substrate 18 has been coated, such as for a flat panel display. The number of paths can be varied, and if desired, repeated paths laterally across the substrate can be made so that there is a deposition along the Y-axis, with shifting at the ends along the X-axis, so that a composite build up can be made.

The entire assembly can be mounted onto a very sturdy support 190, and if desired, an optical sensor which is illustrated generally at 192 can be used for determining the thickness of the deposited film. The optical sensor 192 can be carried on the shower head 127 so it can be moved to any desired location over the substrate for determining thickness.

Other linear actuators can be operated, such as servo motor or linear screws under computer control to achieve the desired motion along the X and Y axes. Linear actuators are widely available commercially and can be purchased from many different suppliers.

There are many ways a shower head assembly 127 can be moved over the substrate to achieve uniform thin film deposition. In the shower head movement pattern shown in FIG. 18, the shower head is first moved to the desired Y position and then moved along the X-axis to achieve uniform film thickness along the X-axis. The shower head is then moved to the next Y-position and then moved along the X-axis as shown. The movement is then repeated until the entire area of the substrate is covered.

The movement pattern of FIG. 18 is capable only to eliminate film thickness variation along the X-axis. Since there may still be film thickness variations along the Y direction, it may be necessary to repeat the same pattern of movement but only displacing one pattern from the next pattern by a small step along the Y-axis. By repeating such patterns many times—tens, hundreds, or thousands of times—film thickness variations along the Y-axis can also be eliminated.

Similarly, it is also possible to first move the shower head to a fixed X-position and then move it along the Y-axis. The step is then repeated until the entire substrate is covered. The pattern can then be repeated by displacing the shower head pattern by small steps until uniform thickness is obtained.

The above motions can also be combined to achieve true uniform coverage and thin film thickness. Such movements can be created by those knowledgeable in motion control devices and computer software and there are many different ways of accomplished the desired objective of uniform thin film deposition with the same process and apparatus by different computer software programs.

Although the present invention has been described with reference to preferred embodiments, workers skilled in the art will recognize that changes may be made in form and detail without departing from the spirit and scope of the invention.

What is claimed is:

1. A virtual impactor for concentrating an aerosol including a first chamber having an aerosol inlet, a first wall of the first chamber having plurality of orifices leading from the inlet, the orifices having central axes and leading to a second chamber, a plurality of receiving tubes mounted on a second wall spaced from the first wall and each receiving tube being axially aligned with one of the orifices, an outlet carrying an air flow out of the second chamber laterally of the axes of the orifices, and a flow restrictor in each of the receiving tubes to control pressure drop across the receiving tubes.

2. The virtual impactor of claim 1 including an outlet from the impactor for flow passing through said receiving tubes.

3. The virtual impactor of claim 1, wherein the flow restrictors comprise orifice plates near an exit end of the receiving tubes.

4. The virtual impactor of claim 1, wherein there are a pair of first chambers formed with a pair of first walls to receive the aerosol, and each first wall having a plurality of orifices leading into a pair of second chambers, each second chamber being defined by second walls spaced from the first walls, and a plurality of receiving tubes in each second wall aligned with the orifices in the respective first chamber, the receiving tubes in each second wall opening to a third chamber, said orifices and receiving tubes being axially aligned whereby flow through the receiving tube from one of the second chambers is opposed in the third chamber by flow from a receiving tube from the other of said second chambers.

5. An aerosol generation and charging apparatus including a source of a compressed gas;
    a first chamber for receiving the compressed gas and maintaining the gas at a desired pressure;
    an electrode in the chamber connected to a power source and providing an electrical field in the first chamber to ionize the gas; and
    a second chamber coupled to the first chamber, the second chamber having an aerosol therein intermixing with the ionized gas to produce an output aerosol "having charged droplets" <indent> "a flow accelerating passageway between the first and second chambers."

6. The apparatus of claim 5 wherein the flow accelerating passageway comprises a flow restriction.

7. The apparatus of claim 5 wherein the flow accelerating passageway comprises an orifice.

8. The apparatus of claim 5 wherein the second chamber comprises an atomizer chamber having a liquid inlet passageway, the accelerating passageway accelerating the ionized gas to a velocity sufficient to atomize liquid entering the second chamber through the liquid inlet passageway.

9. The apparatus of claim 5 and a film deposition head fluidly connected to the second chamber for receiving the output aerosol having charged droplets, the deposition head being electrically conductive and adjacent to a substrate on which deposition of the aerosol is to take place.

10. The apparatus of claim 9 and a support for supporting a substrate adjacent to the deposition head, to receive the output aerosol from the deposition head.

11. The apparatus of claim 10, wherein said support includes a heater for heating the substrate.

12. The apparatus of claim 9, wherein said deposition head comprises a shower head having a plate with a plurality of openings therethrough for depositing the aerosol onto the substrate.

13. The apparatus of claim 9, wherein a power source is connected to the deposition head to provide an electrical polarity the same as the polarity of the charged droplets the substrate comprising an electrically conductive material connected to the power source to have an opposite electrical polarity from the deposition head.

14. The apparatus from claim 9, wherein a power source is connected to the deposition head to provide an electrical polarity the same as the polarity of the charged droplets, the substrate comprising an electrically insulating material, the substrate being supported on an electrically conductive material connected to the power source to have an opposite polarity from the deposition head.

15. The apparatus of claim 9 and a carriage for mounting said deposition head including a rail for supporting the carriage, and a drive for moving the carriage along the rail.

16. The apparatus of claim 15, wherein an arm is supported on said rail at substantially right angles to an axis of the rail, said deposition head being supported on said arm and movable along the arm.

17. The apparatus of claim 16, wherein said deposition head is driven by a controllable, linear drive and moved in a selected path.

18. The apparatus of claim 15, wherein the deposition head comprises a shower head having multiple outlet openings.

19. The apparatus of claim 5, wherein the source of compressed gas comprises compressed air.

20. The apparatus of claim 5, wherein the source of compressed gas comprises an inert gas including a percentage of oxygen greater than 0.1% by volume.

21. The apparatus of claim 9, and a concentrator positioned to receive the aerosol to increase droplet concentration in the aerosol, and having a concentration outlet fluidly coupled to the deposition head.

22. The apparatus of claim 9, and an exhaust shroud surrounding said deposition end and including means for causing a gas flow into the shroud adjacent the substrate to an exhaust passage.

23. The apparatus of claim 21, wherein said concentrator comprises a virtual impactor for classifying the droplets according to size to provide droplets larger than a selected output size of the virtual impactor to the deposition head.

24. A method of improving the deposition of thin films onto a substrate comprising the steps of ionizing a carrier gas, passing the carrier gas into contact with an aerosol to provide a charge to particles in the aerosol, and moving the charged particle aerosol to a deposition head for depositing the aerosol particles "onto a substrate, the method further including the step of supporting the substrate on a support having an opposite polarity relative to the deposition head from a polarity of the charge on the charged particles."

25. The method of claim 24 including a step of concentrating the aerosol prior to depositing the aerosol to the substrate.

26. The method of claim 25, wherein the step of concentrating the aerosol comprises passing the aerosol through a multiple orifice virtual impactor, said virtual impactor classifying particles of the atomized liquid and providing a higher concentration of larger particles in a smaller flow from an outlet of a virtual impactor leading to the film deposition head.

27. The method of claim 26 including providing receiving tubes for receiving an aerosol from each orifice and controlling the pressure drop across each of the receiving tubes to a desired level.

28. The method of claim 27 including the step of providing a restrictor in each receiving tube for carrying out the step of controlling the pressure drop.

29. The method of claim 24 including the step of forming the aerosol in an atomizing nozzle receiving the ionized gas, and intermixing the ionized gas with liquid droplets.

30. The method of claim 29 including the step of regulating the flow of liquid into the atomizing nozzle.

31. The method of claim 30, wherein the step of ionizing the carrier gas comprises passing the gas past an electrode needle to form a corona discharge to ionize the carrier gas molecules.

32. The method of claim 31 including the step of regulating the flow of a compressed gas past the electrode needle.

33. A deposition apparatus including a source of an aerosol containing droplets to be deposited onto a substrate, a deposition head receiving the aerosol and positioned to deposit the material on the substrate, and a support for moving the deposition head in a linear path relative to the substrate, wherein the support comprises a rail, and a controllable drive for moving the deposition head in opposite direction along the rail.

34. The apparatus of claim 33 wherein the support includes an arm movably supported on the rail and positioned at substantially right angles to a longitudinal axis of the rail, the deposition head being supported on said arm and moveable along the arm at substantially right angles to the longitudinal axis of the rail.

35. The apparatus of claim 33 including a source of electrical charge applied to the droplets in the aerosol to provide a unipolar electrical charge to the droplets, and a source of an electric field established between the deposition head and the substrate, the electric field causing the charged particles to be attracted to the substrate.

36. The apparatus of claim 34 wherein the rail supports a carriage, movable along the rail, and wherein the arm is mounted on the carriage, the carriage being linearly driven along the rail under a programmed control.

37. A deposition apparatus for depositing an aerosol onto a substrate, the deposition apparatus comprising a support, "a deposition head having at least one orifice through which an aerosol is passed in direction toward the substrate, the deposition head providing a reduced pressure in a shroud" Replace "gas flow into the shroud" With "gas flow inwardly into the shroud" surrounding said head and having an edge adjacent the substrate, and a gas flow source for providing a gas flow into the shroud around the edge, and an outlet for exhausting the gas flow from the shroud.

38. The apparatus of claim 37, and a support for movably mounting the head and shroud adjacent to the substrate, and the head being mounted for movement across a substantial area of the substrate.

39. The apparatus of claim 37 and an aerosol source providing charged aerosol particles to the deposition head.

40. The apparatus of claim 39, and a source of an electric field established between the head and the substrate to aid in deposition of the aerosol onto the substrate.

* * * * *

UNITED STATES PATENT AND TRADEMARK OFFICE
CERTIFICATE OF CORRECTION

PATENT NO. : 6,349,668 B1
DATED : February 26, 2002
INVENTOR(S) : James J. Sun et al.

It is certified that error appears in the above-identified patent and that said Letters Patent is hereby corrected as shown below:

<u>Title page,</u>
Item [56], References Cited, add the following Patent Nos.
-- 4,284,495
5,306,345 --

<u>Column 3,</u>
Line 53, cancel "No. 5,996,640" and insert -- No. 5,916,640 --.

<u>Column 14,</u>
Line 7, after "having" insert -- a --.
Line 42, cancel the quotation marks.
Line 43, cancel "quote<indent>quote".
Line 44, cancel the quotation marks at the end of the sentence.

<u>Column 15,</u>
Line 37, cancel "end" and insert -- head --.
Lines 49 and 52, cancel the quotation marks.

<u>Column 16,</u>
Lines 44 and 46, cancel the quotation marks.
Line 47, cancel "Replace "gas flow into the shroud" with -- gas flow inwardly into the shroud --.
Line 48, cancel the quotation marks.
Line 50, cancel "gas flow into the shroud" and insert -- gas flow inwardly into the shroud --.

Signed and Sealed this

Twelfth Day of November, 2002

*Attest:*

*Attesting Officer*

JAMES E. ROGAN
*Director of the United States Patent and Trademark Office*